(12) United States Patent
Philliber

(10) Patent No.: US 7,091,601 B2
(45) Date of Patent: Aug. 15, 2006

(54) METHOD OF FABRICATING AN APPARATUS INCLUDING A SEALED CAVITY

(76) Inventor: Joel A. Philliber, 3420 Shallow Pond Dr., Fort Collins, CO (US) 80528

( * ) Notice: Subject to any disclaimer, the term of this patent is extended or adjusted under 35 U.S.C. 154(b) by 0 days.

(21) Appl. No.: 10/837,261

(22) Filed: Apr. 30, 2004

(65) Prior Publication Data

US 2005/0242419 A1    Nov. 3, 2005

(51) Int. Cl.
*H01L 23/12*  (2006.01)
(52) U.S. Cl. .................. 257/704; 438/902; 438/975; 257/710; 257/924
(58) Field of Classification Search .............. 257/704, 257/710, 924, E23.18, E23.123, E23.193, 257/E21.501, E23.128; 438/902, 975, FOR. 438, 438/FOR. 354
See application file for complete search history.

(56) References Cited

U.S. PATENT DOCUMENTS 5,446,316 A  *  8/1995  Temple et al. .............. 257/704
2003/0116825 A1*  6/2003  Geefay et al. .............. 257/619

* cited by examiner

*Primary Examiner*—Jasmine Clark

(57) ABSTRACT

A method of fabricating an apparatus including a sealed cavity and an apparatus embodying the method is disclosed. To fabricate the apparatus, a device chip including a substrate and at least one circuit element on the substrate is fabricated. Also, a cap is fabricated. The cap is attached to the device chip using single phase metal alloy to achieve sealed cavity over the circuit element. The single phase metal alloy allows the cap to be diffusion bonded to the device chip at a higher diffusivity thus allowing diffusion at a lower temperature, lower pressure, shorter period, or a combination of these.

9 Claims, 5 Drawing Sheets

“METHOD OF FABRICATING AN APPARATUS INCLUDING A SEALED CAVITY”

BACKGROUND

The present invention relates to integrated circuit (IC) fabrication technology, and more particularly, to a method of fabricating IC having a sealed cavity.

Some products use packaging technology that involves bonding a cap over a predetermined area of a substrate to create a hermetically sealed cavity. The hermetically sealed cavity is often formed to protect sensitive circuit elements therein. FIG. 1 is a perspective illustration of a sample apparatus 10 including a device chip 20 having a substrate 22 and circuit elements 24 fabricated on the substrate 22. A cap 30 is attached over the device chip 20 creating a hermetically sealed cavity within which the circuit elements 24 are protected.

FIG. 2 illustrates a cut-away side view of the apparatus 10 of FIG. 1 after the bonding process. The hermetically sealed cavity is indicated by reference number 26. As illustrated, bottom of the hermetically sealed cavity 26 is defined by the device chip 20 including the substrate 22 and the circuit elements 24. The top of the hermetically sealed cavity 26 is defined by the cap 30. The sizes of the device chip 20 and the cap 30 can vary greatly depending on implementation but can be, for example, on the order of millimeters (mm) or fractions of millimeters, for example, about 0.5 mm to 2 mm.

Sides of the hermetically sealed cavity 26 are defined by gasket 32 which can be a part of the cap 30. The gasket 32 is attached to the substrate 22 using bonding metal 34 such as pure gold. To achieve the hermetically sealed cavity 26, the bonding agent 34 is applied to the substrate 22, the gasket 32, or both. For the bonding metal 34, pure gold (chemical symbol Au) is often used. Then, the device chip 20 and the cap 30 are pressed together and heated to promote diffusion bonding. The gasket 32 can be about 1 to 10 microns thick.

For some applications, pure gold is used as the metal bonding agent 34 for diffusion bonding of the cap 30 on to the device chip 20. For pure gold, bonding parameters (such as level of pressure, temperature, and diffusion time) to achieve a desirable level of diffusion bond quality are known. However, for other applications, these bonding parameters may be procedurally undesirable or even unachievable. Accordingly, there remains a need for a method of manufacturing an apparatus with sealed cavity that allows for more flexible bonding parameters.

SUMMARY

The need is met by the present invention. In a first embodiment of the present invention, a method of manufacturing an apparatus is disclosed. To manufacture the apparatus, a device chip and a cap are fabricated, the device chip including a substrate and at least one circuit element fabricated on the substrate. Then, the cap is attached to the device chip using single phase metal alloy to achieve sealed cavity over the circuit element.

In a second embodiment of the present invention, a method of manufacturing an apparatus is disclosed. To manufacture the apparatus, a device chip and a cap are fabricated. The device chip includes a substrate, at least one circuit element fabricated on the substrate, and single phase metal alloy surrounding the circuit element. The cap includes single phase metal alloy having same composition as the single phase alloy of the device chip. Then, the cap is attached on the device chip by bonding the single phase metal alloy of the device chip with the single phase metal alloy of the cap.

In a third embodiment of the present invention, a method of manufacturing an apparatus is disclosed. To manufacture the apparatus, a device chip and a cap are fabricated. The device chip includes substrate, and at least one circuit element fabricated on the substrate, and pure base metal surrounding the circuit element. The cap includes single phase metal alloy of the base metal. Then, the cap is attached on the device chip by bonding the base metal of the device chip with the single phase metal alloy of the cap.

In a fourth embodiment of the present invention, a method of manufacturing an apparatus is disclosed. To manufacture the apparatus, a device chip and a cap are fabricated. The cap includes pure base metal. The device chip includes substrate, and at least one circuit element fabricated on the substrate, and single phase metal alloy surrounding the circuit element. Then, the cap is attached on the device chip by bonding the base metal with the single phase metal alloy.

In a fifth embodiment of the present invention, a method of manufacturing an apparatus is disclosed. To manufacture the apparatus, a device chip and a cap are fabricated. The device chip includes a substrate and at least one circuit element fabricated on the substrate. The cap includes a pure base metal having a layer of an alloy metal. The cap is diffusion bonded on the device chip whereby a single phase solid solution is formed by the base metal and the alloy metal.

In a sixth embodiment of the present invention, an apparatus is disclosed. The apparatus includes a device chip and a cap. The device chip includes a substrate and at least one circuit element fabricated on the substrate. The cap is bonded to the device chip thereby defining a cavity which is sealed with a single phase solid solution metal alloy as its bonding agent.

Other aspects and advantages of the present invention will become apparent from the following detailed description, taken in conjunction with the accompanying drawings, illustrating by way of example the principles of the invention.

DETAILED DESCRIPTION

Introduction

Figure 1:
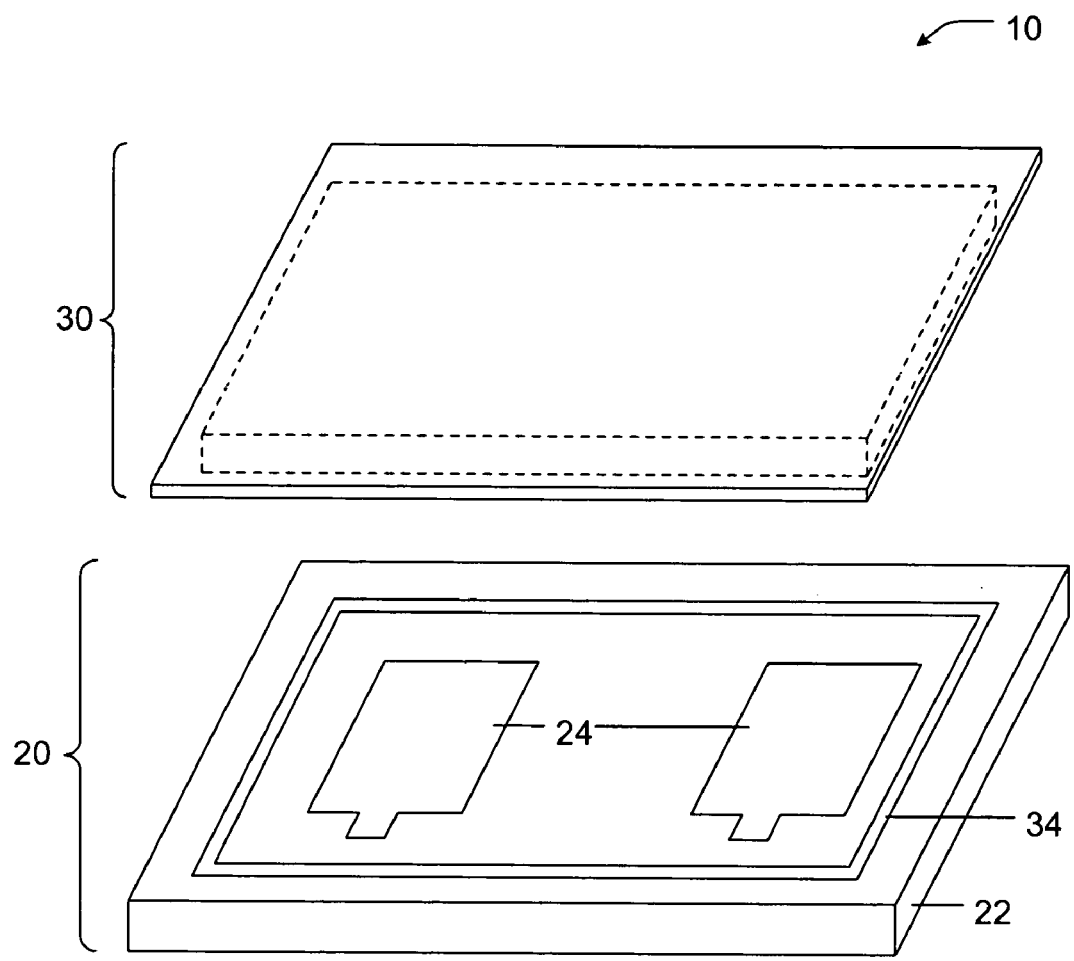
FIG. 1 is a perspective illustration of a sample apparatus.
Figure 2:
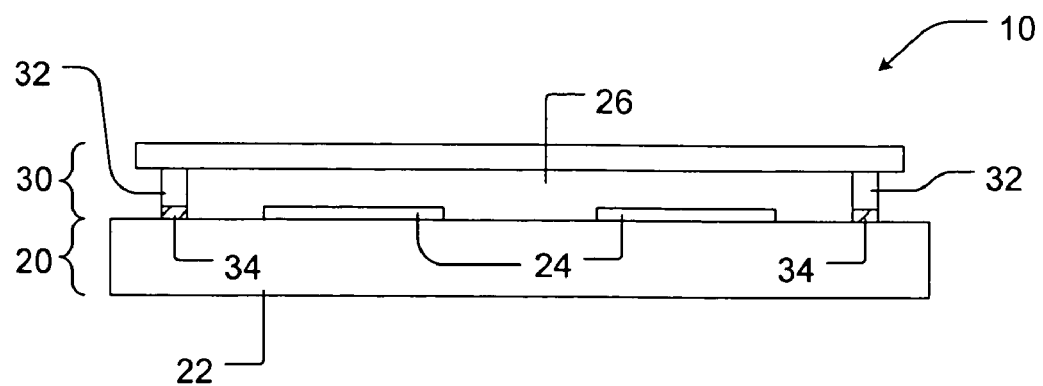
FIG. 2 is a cut-away side view of the apparatus of FIG. 1 following a bonding process.

The present invention will now be described with reference to the FIGS. 1 through 6E which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "above" or "over" relative to other structures, portions, or both. As will be appreciated by those of skill in the art, relative terms and phrases such as "above" or "over" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "above" or "over" other structures or portions would now be oriented "below," "under," "left of," "right of," "in front of," or "behind" the other structures or portions.

As shown in the Figures for the purposes of illustration, embodiments of the present invention are exemplified by a technique of method of manufacturing an apparatus by fabricating a device chip including a substrate and at least one circuit element fabricated on the substrate, fabricating a cap, and attaching the cap on the device chip using single phase metal alloy to achieve sealed cavity over the circuit element. For example, instead of pure gold (Au), single phase gold solid solution is used as the diffusion bonding metal. Use of the single phase metal alloy allows the bonding to take place at a lower pressure, lower temperature, within a shorter time, or any combination of these parameters.

Diffusion rates (diffusivity) of solids depend, among other factors, on a ratio ($T/T_M$) of the temperature (T) of the solid (at the time of bonding) and the melting temperature ($T_M$) of the solid. This ratio is known in the art as homologous temperature. For example, consider a diffusion bonding process using pure gold solid which has a melting temperature $T_M$ of approximately 1337 degrees Kelvin (K). In this document, all temperature specifications are in Kelvin scale unless otherwise noted. At a bonding temperature of 633 degrees Kelvin, pure gold has homologous temperature of approximately 0.47 (=633/1337).

Higher homologous temperature indicates a higher rate of diffusion. As indicated by the mathematical relationship of the homologous temperature ratio $T/T_M$ at any given bonding temperature T, the homologous temperature can be raised by lowering the melting temperature $T_M$ of the solid.

The melting temperature can be lowered in the present example by adding an alloy metal such as zinc (Zn) to the pure gold to produce a solid gold solution ("gold solid solution" here is an alloy solid of mostly gold and some other metal such as zinc, see below for definitions and explanations). For example, addition of zinc of approximately 12 atomic percent to pure gold results in gold solid solution that has a melting temperature of 1133 degrees Kelvin. At bonding temperature of 633 degrees Kelvin, this gold solid solution has a homologous temperature of 0.56 (=633/1133). This represents an approximately 20 percent gain in the homologous temperature compared to the homologous temperature 0.47 of pure gold solid. This is discussed in more detail below. In this document, phrase "alloy metal" is used to indicated metal other than the base metal (for example, gold) that is added to the base metal to form a solid solution. Thus, the "alloy metal" is a pure metal other than the base metal.

Phases and Solid Solutions

In terms of microstructure, a phase of a material refers to degree of heterogeneity of the material in terms of its composition, structure, or both. For example, pure water is a single phase liquid. That is, all portions or regions of the water are homogeneous in its composition and structure. When a relatively small amount of table salt (Sodium Chloride) is added and stirred, the salt is dissolved within the water and a single phase liquid solution of salt water results. The resultant salt water liquid solution is single phase because the liquid solution is homogeneous in its composition and structure. Further additions of table salt to the single phrase liquid solution causes the water to be saturated with salt and unable to dissolve more salt. Addition of salt beyond the saturation point results in a liquid solution having liquid regions of salt water and solid regions of un-dissolved salt particles. This resultant liquid solution is referred to as a dual phase liquid solution because there are two distinct structures within the liquid solution—(1) the liquid regions of salt water and (2) solid regions of un-dissolved salt particles.

In the preceding example, a water liquid solution with salt is used to demonstrate the phases of liquid solutions. Likewise, solid solutions of metals can be classified with one or more phases. For example, a pure base metal such as, for example pure gold, is a single phase solid. That is, all portions or regions of the solid base metal are homogeneous in its composition and structure. Another metal, (referred to as alloy metal) can be added to the base metal to form a solid solution alloy having a single phase. An alloy of two metallic elements is referred to as a binary alloy. In some binary alloy systems, the two elements are completely soluble in each other in certain proportions and results in a solid solution alloy having a single phase.

Alloys melt over a range of temperatures between the liquidus and solidus temperatures. The solidus temperature is where melting begins, but the alloy is mostly solid at this point. For convenience, in this document, the solidus temperature of alloys including solid solutions is also referred to as its melting temperature.

Figure 3:
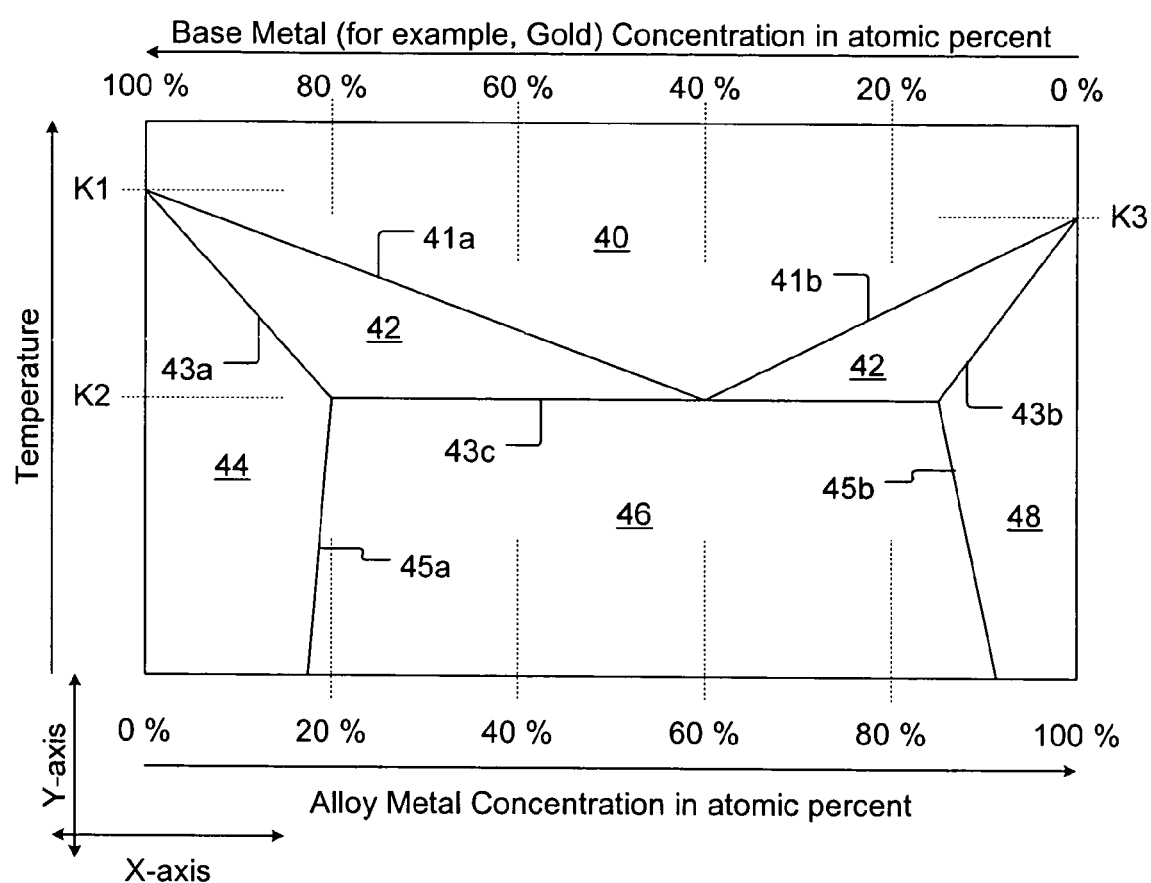
FIG. 3 is a partial solubility equilibrium diagram.

FIG. 3 can be used to illustrate the gold solid solution. FIG. 3 is a partial solubility equilibrium diagram (hereinafter the "diagram") often used in the art of material science. In the diagram, the X-axis represents the amount of base metal in atomic percent versus the amount of alloy metal in atomic percent. For example, the base metal can be gold (Au) and the alloy metal can be any one of, for example, silver (Ag), aluminum (Al), mercury (Hg), copper (Cu), zinc (Zn), tin (Sn), or silicon (Si). Atomic percent is percentage calculated based on the number of atoms (rather than, for example, relative atomic weight or size). In the diagram, the Y-axis represents temperature in Kelvin.

The diagram includes liquidus temperature curves 41a and 41b (collectively referred to using numeral 41), solidus temperature curves 43a and 43b (collectively referred to using numeral 43), and solvus curves 45a and 45b (collectively referred to using numeral 45). The liquidus temperature curve 41 is a locus of points indicating a temperature above which the metal or alloy is in stable liquids state and below which some solid is present; the lowest temperature at which a metal or alloy is completely liquid. The solidus temperature curve 43 is a locus of points indicating a temperature below which the metal or alloy is in stable solid state with no liquid present above which some liquid is present; the highest temperature at which a metal or alloy is completely solid and also can be considered the temperature at which the metal or alloy begins to melt, or the melting temperature. The solvus curve 45 is a locus of points indicating the limits of complete solubility of two metals.

In the diagram, liquid region 40 above the liquidus curve 41 is the region in which the metal alloy is in the liquid state. As the metal alloy cools, it crosses the liquidus curve 41 into pasty region 42 where the alloy exists partially in solid form and partially in liquid form sometimes referred to as paste state. The pasty regions 42 lie between the liquidus curve 41 and the solidus curve 43. As the metal alloy cools further, it crosses the solidus curve 43 and into the solid regions 44, 46, or 48 depending on its percent composition.

For example, if the metal alloy is mostly base metal (e.g., gold in the present example) and partially alloy metal in atomic percentage that is less than (or left of) the first solvus curve 45*a*, then the cooling alloy forms a single phrase solid solution in the base metal solid solution region 44. If the metal alloy is mostly alloy metal (e.g., silver or other alloy metals listed above) and partially base metal in atomic percentage that is less than (or right of) the second solvus curve 45*b*, then the cooling alloy forms a single phrase solid solution in the alloy metal solid solution region 48. If the metal alloy includes the base metal and the alloy metal percentages that fall between the two solvus curves 45*a* and 45*b*, then the cooling alloy forms a dual phase eutectic solid in the alloy metal solid region 46. The eutectic solid is not desirable for the present application for various reasons.

Various Solid Solutions

As already discussed above, diffusivity of material can be increased by increasing homologous temperature of the material. Since the homologous temperature is a ratio $(T/T_M)$ of the temperature (T) of the material (for example, at the time of bonding) and its melting temperature $(T_M)$, the homologous temperature can be increased by reducing the melting temperature of the material. The melting temperature of the material can be reduced by introducing alloys to the material.

Figure 4:
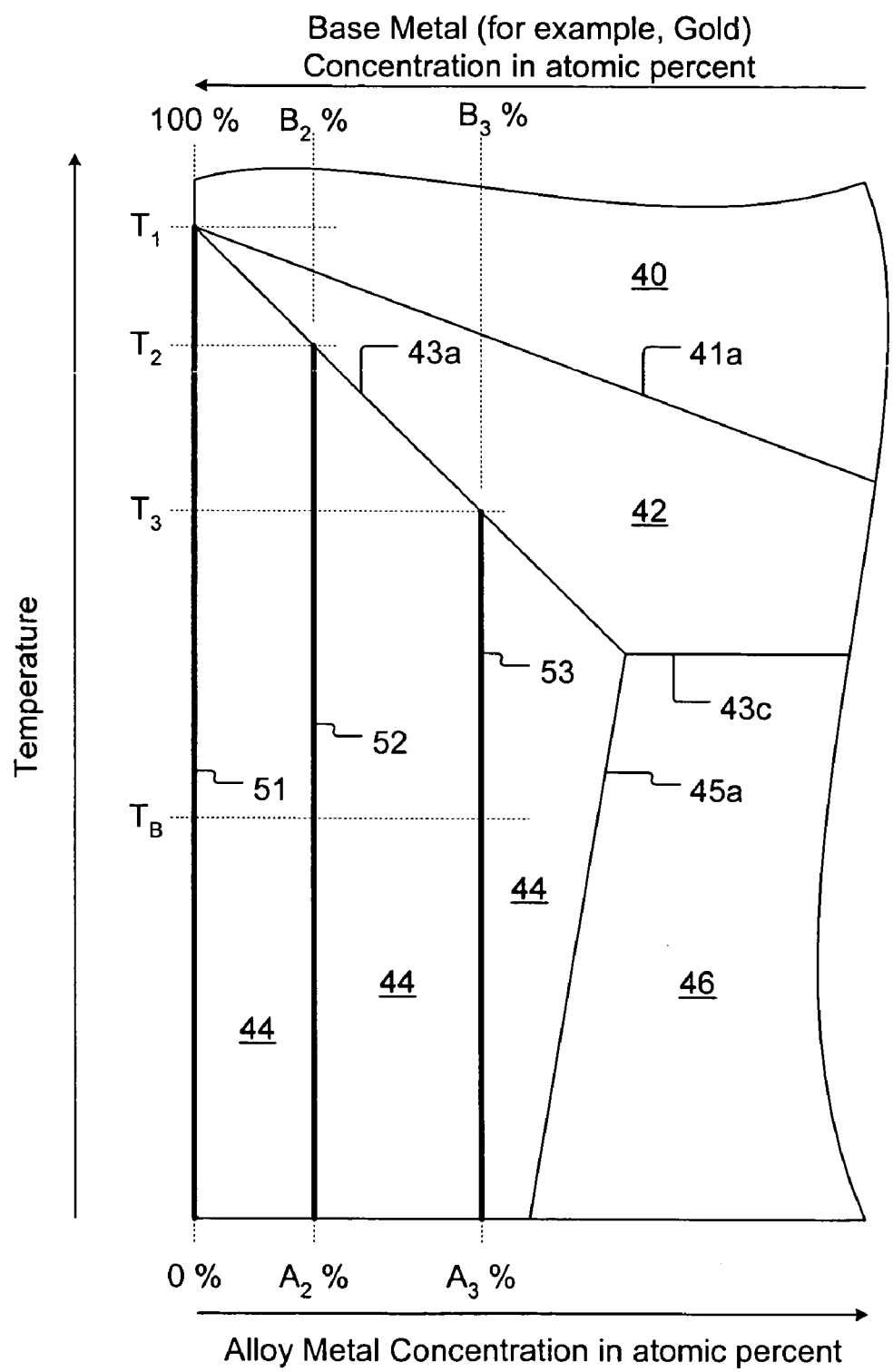
FIG. 4 is a portion of the partial solubility equilibrium diagram of FIG. 3 including additional annotations.

A portion of the diagram of FIG. 3 is reproduced as FIG. 4 including additional annotations. In FIG. 4, thicker lines 51, 52, and 53 represent, respectively, a first, a second and a third composition alloys including a base metal and an alloy metal in various proportions. The base metal can be, for example, gold. Alloy metal can be any one of, for example, silver (Ag), aluminum (Al), mercury (Hg), copper (Cu), zinc (Zn), tin (Sn), or any other material that has some solid solubility in the base metal such as gold. There are other metals that can be dissolved into gold to form solid solutions, for example, silicon (Si). There is some Si solubility in Au but it is very small.

In the illustrated example, the metal alloys 51, 52, and 53, when in solid state, are in the single phase solid solution region 44 of the diagram of FIGS. 3 and 4; thus, the metal alloys 51, 52, and 53 are referred to as single phase metal alloys 51, 52, and 53 or, equivalently, in the present example, as gold solid solutions 51, 52, and 53.

In the example, the first solid solution 51 is pure (100 percent) base metal (for example, gold) and zero percent alloy metal. The first solid solution 51 is illustrated having a solidus temperature (or melting temperature) of $T_1$. For pure gold, the melting temperature is approximately 1337 degrees Kelvin. FIG. 4 also illustrates temperature of the solid solution at bonding which can be, for example, 633 degrees Kelvin. As discussed above, for the present example, at the bonding temperature of 633 degrees Kelvin, solid gold solution 51, has homologous temperature of approximately 0.47 (=633/1337). Generally, homologous temperature greater than 0.5 is desired for the diffusion bonding of the present invention but lower homologous temperature can be used.

The second sample solid solution 52 is mostly base metal ($B_2$ atomic percent base metal) with a relatively small percentage of alloy metal ($A_2$ atomic percent alloy metal). In the present example, the base metal can be gold at between approximately 90 atomic percent to approximately 95 atomic percent, and the alloy metal can be zinc at between approximately 5 atomic percent to approximately 10 atomic percent, resulting in a second gold solid solution 52. The second solid solution 52 is illustrated having a solidus temperature (or melting temperature) of $T_2$ which is less than $T_1$.

For the second solid solution 52, the melting temperature $T_2$ is less than $T_1$ value of 1337 degrees Kelvin. The actual melting temperature $T_2$ depends on the base metal used, alloy metal used, and their proportion, but can be, for example, approximately about 1250 degrees Kelvin. Then, at bonding temperature of 633 degrees Kelvin, the second solid solution 52 has a homologous temperature of approximately 0.51. This represents an approximately 8.5 percent gain in the homologous temperature compared to the homologous temperature 0.47 of pure gold solid 51.

The third sample solid solution 53 is mostly base metal ($B_3$ atomic percent base metal) with a relatively small percentage of alloy metal ($A_3$ atomic percent alloy metal). In the present example, the base metal can be gold at approximately 88 atomic percent, and the alloy metal can be zinc at approximately 12 atomic percent, resulting in a second gold solid solution 53. The third solid solution 53 is illustrated having a solidus temperature (or melting temperature) of $T_3$ which is less than $T_1$ and less than $T_2$.

For the third solid solution 53, the melting temperature $T_3$ is less than $T_1$ and less than $T_2$. The actual melting temperature $T_3$ depends on the base metal used, alloy metal used, and their proportion. For example, addition of zinc of approximately 12 atomic percent to pure gold results in gold solid solution that has a melting temperature of 1133 degrees Kelvin. At bonding temperature of 633 degrees Kelvin, this third gold solid solution 53 has a homologous temperature of 0.56. This represents an approximately 20 percent gain in the homologous temperature compared to the homologous temperature 0.47 of pure gold solid.

TABLE 1 below lists some effects of adding different alloying elements to gold. All of the compositions are in atomic percent and would result in a gold solid solution. Please note that different bonding temperature can be used for different results.

TABLE 1

| Element | Composition in atomic percent | Solidus Temperature in Kelvin | Bonding Temperature in Kelvin | homologous temperature ratio |
| --- | --- | --- | --- | --- |
| Gold (Au) |  | 1337 | 643 | 0.48 |
| Silver (Ag) | 20% | 1327 | 643 | 0.48 |
| Aluminum (Al) | 10% | 1088 | 643 | 0.59 |
| Mercury (Hg) | 15% | 773 | 643 | 0.83 |
| Copper (Cu) | 20% | 1213 | 643 | 0.53 |
| Zinc (Zn) | 12% | 1133 | 643 | 0.57 |
| Tin (Sn) | 4% | 1113 | 643 | 0.58 |

Application of Solid Solution for Sealed Cavity

Figure 5:
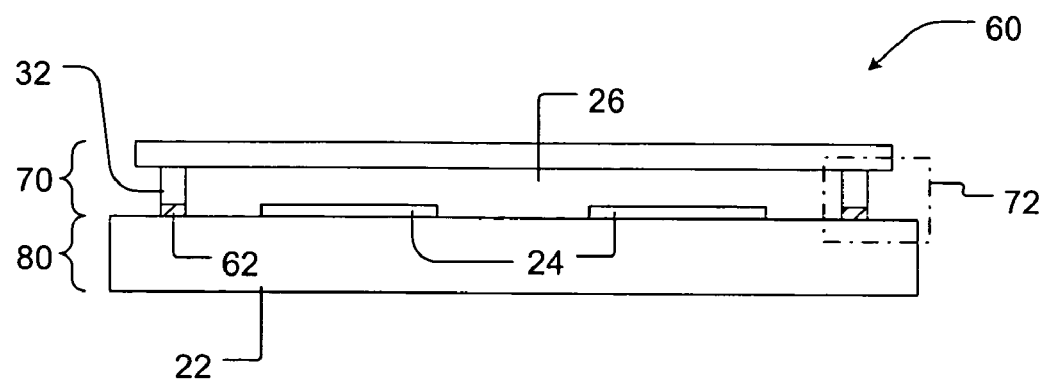
FIG. 5 is a cut-away side view of an apparatus in accordance with one embodiment of the present invention.

FIG. 5 illustrates a cut-away side view of an apparatus 60 in accordance to a first embodiment of the present invention.

The apparatus 60 includes many portions which are similar to corresponding portions of the apparatus 10 of FIG. 1. For simplicity, portions of the apparatus 60 of FIG. 5 having similar corresponding portions in the apparatus 10 of FIG. 1 are assigned the same reference numbers; portions of the apparatus 60 of FIG. 5 different than corresponding portions in the apparatus 10 FIG. 1 are assigned different reference numbers.

Referring to FIG. 5, an apparatus 60 includes a device chip 80 having a substrate 22 and at least one circuit elements 24 fabricated on the substrate 22. A cap 70 is attached over the device chip 80 creating a hermetically sealed cavity 26 within which the circuit elements 24 are protected. The cap 70 is bonded to the device chip 80 and sealed with a single phase solid solution metal alloy 62 as its bonding agent. In one embodiment, the single phase solid solution metal alloy is, for example, the second solid solution 52 or the third solid solution 53 as described above in reference to FIG. 4. For base metal of gold, the second solid solution 52 or the third solid solution 53 can be single phase solid solution metal alloy.

Following paragraphs continues to refer to FIG. 5 in addition to FIGS. 6A through 6E as cited. In FIGS. 6A through 6E varying embodiments of a portion 72 of the apparatus 60 of FIG. 5 is illustrated as it would have appeared before the device chip 80 and the cap 70 are attached. In FIGS. 6A through 6E, the varying embodiments the portion 72 are designated with reference numerals 7a, 7b, 7c, 7d, and 7e to indicate that these are alternative embodiments of the same portion 72.

Figure 6A:
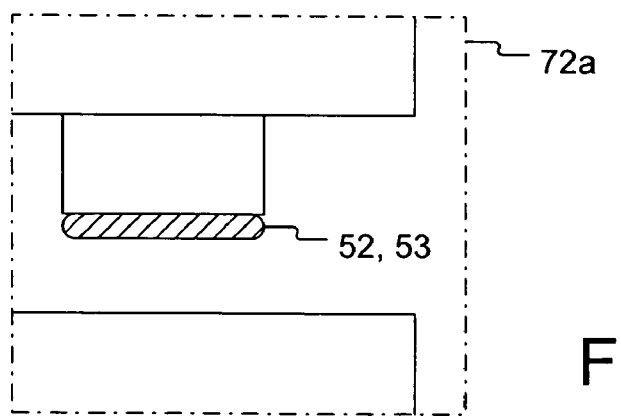
FIGS. 6A through 6E are different embodiments of a portion of the apparatus illustrated in FIG. 5.

In a first embodiment of the present invention, the apparatus 60 is manufactured by fabricating the device chip 80 including a substrate 22 and at least one circuit element 24 fabricated on the substrate 22 and also fabricating the cap 70. Then, attaching the cap 70 on the device chip 80 using single phase metal alloy 52 or 53 to achieve sealed cavity 26 over the circuit element 24. The cap 70 surrounds the circuit elements 24. The cap 70 may also include a gasket 32. As discussed, single phase metal alloy 52 or 53 can include a gold solid solution having base metal gold and an alloy metal selected from a group consisting of silver, aluminum, mercury, copper, zinc, and tin, or silicon. FIG. 6A illustrates the first embodiment of the portion 72a of the apparatus 60. Here, the single phase metal alloy 52, 53 is illustrated on the cap 70. Alternatively, the phase metal alloy 52, 53 can be deposited on the device chip 80 before the step of attaching it to the cap 70. In the illustrated embodiment, the phase metal alloy 52, 53 can be deposited having a thickness in the order of microns, for example, one to two microns. This can vary greatly depending on the implementation.

Figure 6B:
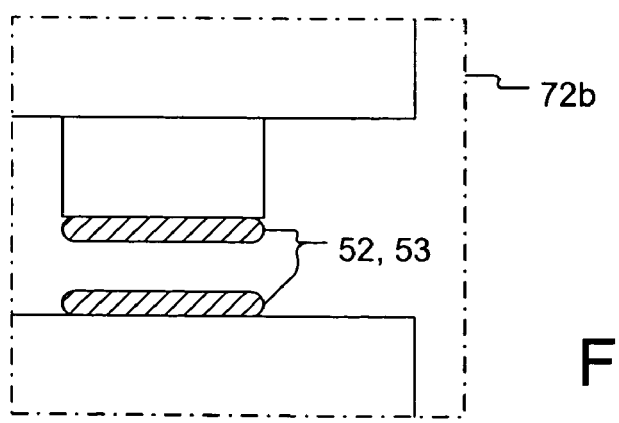

In a second embodiment of the present invention, the device chip 80 can be fabricated having a single phase metal alloy 52 or 53 surrounding the circuit element 24 and the cap 70 can be fabricated having a single phase metal alloy 52 or 53 that is same composition as the single phase metal alloy 52 or 53 of the device chip 80. FIG. 6B illustrates the second embodiment of the portion 72b of the apparatus 60. Here, the phase metal alloy 52, 53 is illustrated on the cap 70 and on the device chip 80. Then, the cap 70 is attached to the device chip 80 by bonding the single phase metal alloy 52 or 53 of the device chip 80 with the single phase metal alloy 52 or 53 of the cap 70.

Figure 6C:
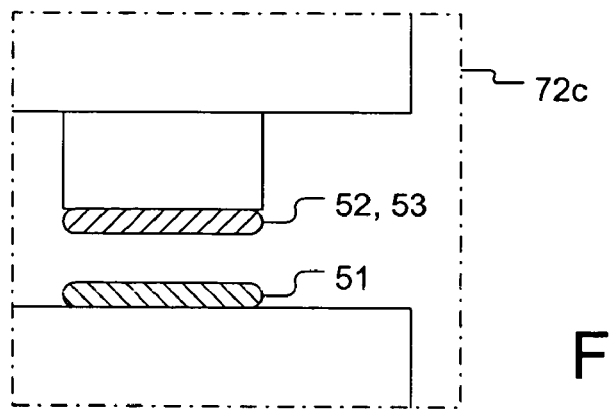

In a third embodiment of the present invention, the device chip 80 can be fabricated having a pure base metal 51 such as gold surrounding the circuit element 24 and the cap 70 can be fabricated having a single phase metal alloy 52 or 53 of the base metal. FIG. 6C illustrates the third embodiment of the portion 72c of the apparatus 60. Here, the single phase metal alloy 52, 53 is illustrated on the cap 70, and the pure base metal 51 is illustrated on the device chip 80. Then, the cap 70 is attached to the device chip 80 by bonding the base metal 51 with the single phase metal alloy 52.

Figure 6D:
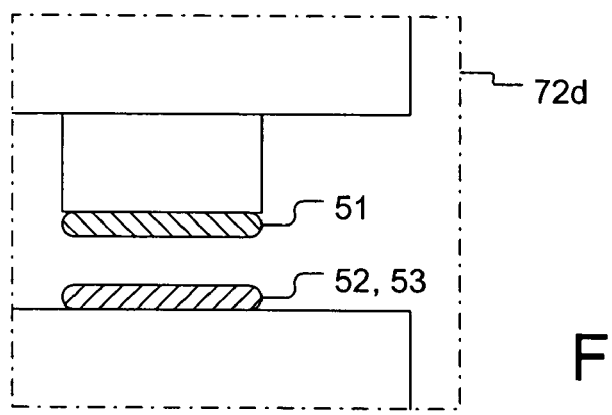

In a fourth embodiment of the present invention, the device chip 80 can be fabricated having a single phase metal alloy 52 or 53 surrounding the circuit element 24 and the cap 70 can be can be fabricated having pure base metal 51 such as gold. FIG. 6D illustrates the fourth embodiment of the portion 72d of the apparatus 60. Here, the phase metal alloy 52, 53 is illustrated on the device chip 80, and the pure base metal 51 is illustrated on the cap 70. Then, the cap 70 is attached to the device chip 80 by bonding the single phase metal alloy 52 or 53 with the pure base metal 51.

Figure 6E:
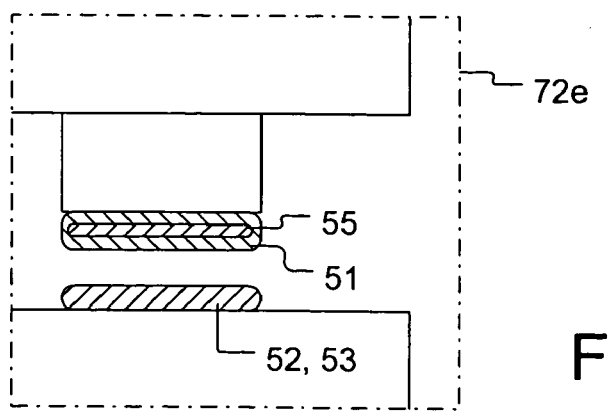

In a fifth embodiment of the present invention, the device chip 80 can be fabricated having the circuit element 24 and the cap 70 can be can be fabricated with a pure base metal 51 such as gold and having an encapsulated layer of an alloy metal within the pure base metal 51. FIG. 6E illustrates the fifth embodiment of the portion 72e of the apparatus 60. Here, the base metal 51 is illustrated on the cap 70 having an encapsulated layer of alloy metal 55. Then the cap 70 is diffusion bonded onto the device chip 80 where a single phase solid solution is formed by the base metal 51 and the alloy metal 55 using pressure and temperature, thermo compression technique. In this document, phrase "alloy metal" is used to indicated metal other than the base metal (for example, gold) that is added to the base metal to form a solid solution. Thus, the "alloy metal" is a pure metal other than the base metal.

For example, the alloy metal 55 can be zinc. When the apparatus 60 is heated during the bonding cycle, the two metals (Au and Zn) inter-diffuse to create a solid solution alloy. To create an alloy solid solution that has 10 atomic percent zinc with gold base, 10 micron-thick base metal can envelope a five micro-thick zinc layer. This base metal 51—alloy metal 55 structure of the cap can be bonded to either another base metal—alloy metal structure on the device chip 80 or a single phase metal alloy 52, 53 layer on the device chip 80. For simplicity, FIG. 6E illustrates the base metal 51—alloy metal 55 of the cap 70 to be bonded to a single phase metal alloy 52, 53 layer.

In all of the embodiments of the present invention, the attachment or diffusion bonding is accomplished using a wide range of temperature and pressures depending on various factors and desired process parameters. For example, for gold solid solution having approximately 12 atomic percent zinc, a bonding temperature ranging from approximately 600 degrees Kelvin to approximately 700 degrees Kelvin is used at pressures up to 50 MPa (MegaPascal) and times varying from approximately 30 minutes to approximately three hours. Of course, these parameters can be different when different base metal is used, different alloy is used, different proportions are used, or any combination of these. The apparatus 60 has dimension in the order of tens of microns thick and hundreds of microns in lateral dimensions. The circuit elements 24 can be any circuits, for example, resonators or electronic filters.

CONCLUSION

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A method of manufacturing an apparatus, the method comprising:
   fabricating a device chip including a substrate and at least one circuit element fabricated on the substrate;
   fabricating a cap;
   applying a pure base metal on the device chip;
   applying a single phase metal alloy of the base metal on the cap;
   aligning the pure base metal of the device chip and the single phase metal alloy of the base metal of the cap; and
   diffusing bonding the cap onto the device chip whereby sealed cavity over the circuit element results.

2. The method recited in claim 1 wherein the cap further comprises a gasket.

3. The method recited in claim 1 wherein the single phase metal alloy includes gold solid solution comprising gold and a metal selected from a group consisting of silver, aluminum, mercury, copper, zinc, tin, silicon.

4. A method of manufacturing an apparatus, the method comprising:
   fabricating a device chip including a substrate, at least one circuit element fabricated on the substrate, and at least one of single phase metal alloy and pure base metal surrounding the circuit element;
   fabricating a cap including at least one of single phase metal alloy having same composition as the single phase alloy of the device chip and pure base metal having same composition as the pure base metal of the device chip; and
   attaching the cap onto the device chip by diffusion bonding.

5. The method recited in claim 4 wherein the single phase metal alloy includes gold solid solution comprising gold and a metal selected from a group consisting of silver, aluminum, mercury, copper, zinc, tin, and silicon.

6. The method recited in claim 4 wherein the cap further comprises a gasket.

7. The method recited in claim 4 wherein the base metal is gold.

8. A method of manufacturing an apparatus, the method comprising:
   fabricating a device chip including a substrate and at least one circuit element fabricated on the substrate;
   fabricating a cap including a pure base metal having a layer of an alloy metal; and
   diffusing bonding the cap onto the device chip whereby a single phase solid solution is formed by the base metal and the alloy metal.

9. The method recited in claim 8 wherein the single phase metal alloy includes gold solid solution comprising gold and a metal selected from a group consisting of silver, aluminum, mercury, copper, zinc, tin, and silicon.

* * * * *